(12) United States Patent
Bringivijayaraghavan (10) Patent No.: US 8,582,380 B2
(45) Date of Patent: Nov. 12, 2013

(54) SYSTEMS, CIRCUITS, AND METHODS FOR CHARGE SHARING

(75) Inventor: Venkatraghavan Bringivijayaraghavan, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 14 days.

(21) Appl. No.: 13/333,822

(22) Filed: Dec. 21, 2011

(65) Prior Publication Data

US 2013/0163358 A1    Jun. 27, 2013

(51) Int. Cl.
 *G11C 7/12*    (2006.01)
(52) U.S. Cl.
 USPC .......................................... 365/203; 365/226
(58) Field of Classification Search
 USPC ................................................ 365/203, 226
 See application file for complete search history.

(56) References Cited

U.S. PATENT DOCUMENTS

| | | | |
|---|---|---|---|
| 5,745,423 A | 4/1998 | Tai | |
| 5,801,574 A | 9/1998 | Martin et al. | |
| 6,262,920 B1 | 7/2001 | Louie et al. | |
| 6,310,809 B1 | 10/2001 | Roohparvar et al. | |
| 6,356,115 B1 | 3/2002 | Dabral et al. | |
| 6,496,425 B1 | 12/2002 | Abedifard et al. | |
| 6,717,459 B2 | 4/2004 | Blodgett | |
| 6,738,300 B2 | 5/2004 | Barth, Jr. | |
| 6,778,455 B2 | 8/2004 | Bell | |
| 6,785,179 B1 | 8/2004 | Bull et al. | |
| 6,845,051 B2 | 1/2005 | Komura | |
| 7,394,701 B2 | 7/2008 | Jung et al. | |
| 7,679,948 B2 | 3/2010 | Park et al. | |
| 7,940,581 B2 | 5/2011 | Arsovski et al. | |
| 8,223,567 B2 * | 7/2012 | Abu Rahma et al. | 365/203 |
| 2003/0012047 A1 * | 1/2003 | Morgan | 365/63 |
| 2006/0262069 A1 | 11/2006 | Do et al. | |
| 2007/0047324 A1 | 3/2007 | Ha | |
| 2008/0136806 A1 | 6/2008 | Lee et al. | |
| 2009/0128533 A1 | 5/2009 | Tsubata | |
| 2009/0147559 A1 * | 6/2009 | Lee et al. | 365/149 |
| 2010/0214833 A1 * | 8/2010 | Takemura et al. | 365/163 |
| 2011/0116322 A1 | 5/2011 | Seol et al. | |
| 2011/0128764 A1 * | 6/2011 | Hosoe et al. | 365/51 |
| 2011/0149662 A1 | 6/2011 | Batra et al. | |
| 2011/0205800 A1 | 8/2011 | Roohparvar | |
| 2012/0105494 A1 | 5/2012 | Lee et al. | |
| 2012/0169783 A1 | 7/2012 | Park | |

\* cited by examiner

*Primary Examiner* — Michael Tran
(74) *Attorney, Agent, or Firm* — Dorsey & Whitney LLP (57) ABSTRACT

Systems, circuits, and methods are disclosed for charge sharing. In one such example system, a first line is configured to be driven to a first voltage representative of data to be placed on the first line and then precharged to a first precharge voltage. A second line is configured to be driven to a second voltage representative of data to be placed on the second line and then precharged to a second precharge voltage. A charge sharing device is coupled between the first line and the second line. The charge sharing device is configured to selectively allow charge from the first line to flow to the second line after the first and second lines are driven to the respective first and second voltages representative of data to be placed on the respective lines.

33 Claims, 6 Drawing Sheets

SYSTEMS, CIRCUITS, AND METHODS FOR CHARGE SHARING

TECHNICAL FIELD

Embodiments of the invention relate generally to integrated circuits, and more particularly, in one or more of the illustrated embodiments, to charge sharing.

BACKGROUND OF THE INVENTION

In integrated circuits, several different design styles of lines are available for carrying electrical signals. For example, a static style of line may be driven by an inverter (such as a complementary metal-oxide-semiconductor or CMOS inverter) or by a non-inverting buffer. If the line is relatively long, it may be divided into several segments, and an inverter or non-inverting buffer may drive each segment in response to the signal received from the previous segment. In a precharge style of line, each line may be precharged to a certain logic level (for example, to a logic high), and then may be driven to a logic level representative of data (e.g., input/write data, output/read data, address data, command data, etc.) to be placed on the line. As used herein, a logic high may be a voltage associated with a voltage source node, such as VCC and may be, for example 1.35v, whereas a logic low may be a voltage associated with a reference voltage node, such as ground. Typically, if there is a plurality of lines (for example, data read lines in a memory), all of the lines are precharged to the same logic level. Following precharge, the lines may be driven to a logic level representative of data to be placed on the line by selectively maintaining the precharged logic level, or by changing the logic level. precharge style lines may be faster than static style lines, may have lower input capacitance, may have less contention (including during switching), may favor one logic level, and so forth. precharge style lines, however, may waste charge (and thus waste power) as a result of the precharging. For example, if a line or segment of line is precharged to a logic high, the charge required ("Q") to precharge the line to a logic high will be wasted if the data to be placed on the line is a logic low because that charge will be discharged by, for example, coupling the line to a reference voltage node such as ground. In general, the longer the line, the greater the total capacitance the line will have, and, therefore, the more charge that may be wasted because the line will require a larger Q to precharge the line, which may be subsequently discharged. Also, in general, the faster the speed at which the line is operated, the more charge that may be wasted because the line will be precharged more frequently.

Integrated circuits in today's apparatuses generally include long lines and are operated at relatively fast operating speeds. At the same time, however, it is generally desirable to reduce power consumption in order to, for example, reduce heat and/or extend battery life for mobile apparatuses. As used herein, an apparatus may refer to a number of different things, such as circuitry, a memory device, a memory system (e.g., SSD) or an electronic device or system (e.g., a computer, smart phone, server, etc.).

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
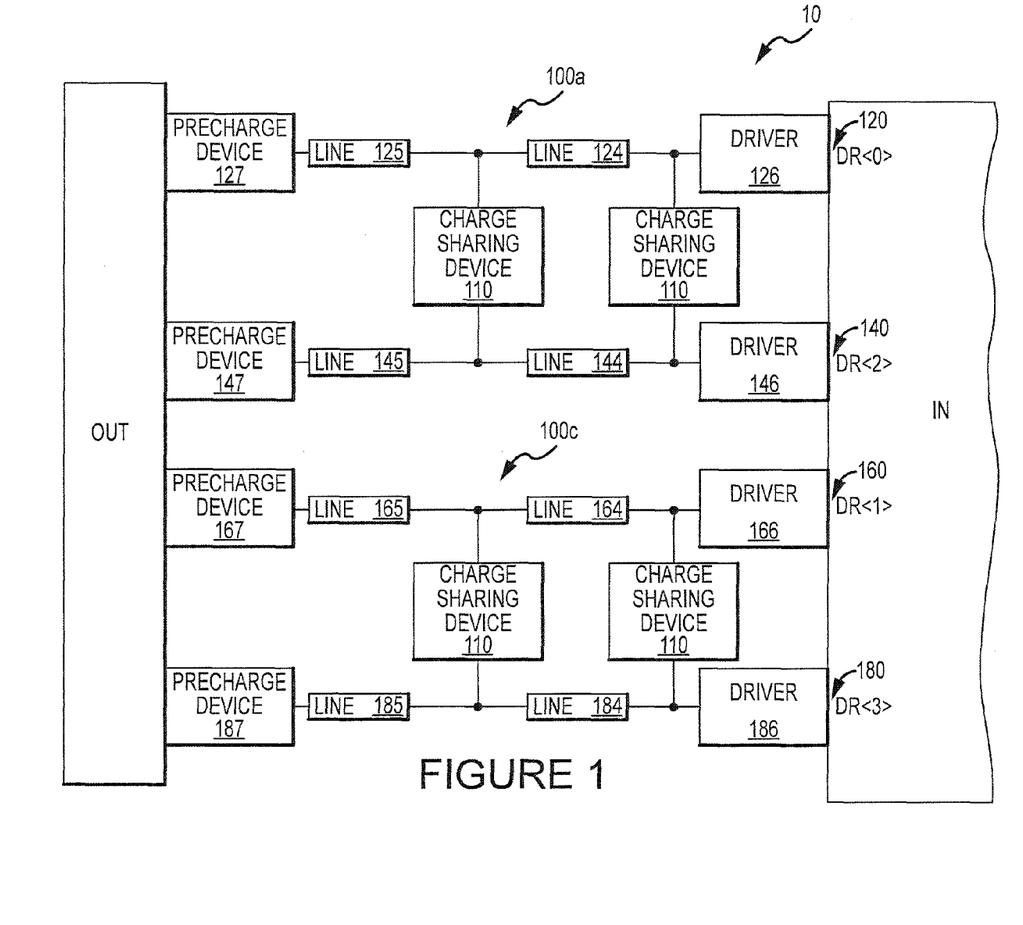
FIG. 1 is a block diagram of an apparatus with a plurality of charge sharing systems according to an embodiment of the present invention.

FIG. 1 illustrates an apparatus 10 with a plurality of precharge style lines 120, 140, 160, 180 and two charge sharing systems 100a, 100c according to an embodiment of the invention. A first charge sharing system 100a may include a first precharge style line 120, a second precharge style line 140, and one or more charge sharing devices 110. A second charge sharing system 100c may include a third precharge style line 160, a fourth precharge style line 180, and one or more charge sharing devices 110.

The precharge style lines 120, 140, 160, 180 may carry electrical signals from one location to another. As one example and as illustrated in FIG. 1, the precharge style lines 120, 140, 160, 180 may be data read (DR) lines that transmit read data from a respective input node IN to a respective output node OUT.

Each of the lines 120, 140, 160, 180 may be relatively long; each line may be, for example, 64,000 microns long. Each line 120, 140, 160, 180 may have a resistance and a capacitance which may be distributed over the length of the line. Each line 120, 140, 160, 180 may, however, be approximated as a plurality of sections of lines, each section having a lumped capacitance and a lumped resistance. For example, the first line 120 may include a first section 124 and a second section 125. Similarly, the second line 140 may include a first section 144 and a second section 145, the third line 160 may include a first section 164 and a second section 165, and the fourth line 180 may include a first section 184 and a second section 185. Of course, each line 120, 140, 160, 180 may alternatively be approximated using a different number of sections.

Each line 120, 140, 160, 180 may be precharged by a respective precharge device and driven by a respective driver. For example, the first line 120 may be precharged by a first precharge device 127 and driven by a first driver 126. Similarly, the second line 140, the third line 160, and the fourth line 180 may each be precharged by a respective precharge device 147, 167, 187, and driven by a respective driver 146, 166, 186. As illustrated in FIG. 1, each of the drivers 126, 146, 166, 186 may couple the respective input node IN to the respective lines 120, 140, 160, 180. In other words, the respective drivers 126, 146, 166, 186 may be placed at the beginning of each of the lines 120, 140, 160, 180, which is illustrated in FIG. 1 as being on the right side of the lines. Also as illustrated in FIG. 1, each of the respective precharge devices 127, 147, 167, 187 may couple each of the respective lines 120, 140, 160, 180 to a respective output node OUT. In other words, the respective precharge devices 127, 147, 167, 187 may be placed at the end of each of the lines 120, 140, 160, 180, which is illustrated in FIG. 1 as being on the left side of the lines. In other embodiments (not illustrated in FIG. 1), however, drivers, and/or precharge devices may be positioned in other places along the lines 120, 140, 160, 180 in addition to or in place of the drivers 126, 146, 166, 186 and the precharge devices 127, 147, 167, 187 illustrated in FIG. 1. As just one example, the precharge devices 127, 147, 167, 187 may be placed near the end but not at the very end of the respective lines 120, 140, 160, 180.

The first and second lines 120, 140 may be coupled by one or more charge sharing devices 110. Similarly, the third and fourth lines 160, 180 may be coupled by one or more charge sharing devices 110. In general, any number of precharge devices 110 may couple any number of lines 120, 140, 160, 180 (including more than two lines) at any position along the lines 120, 140, 160, 180, and the number of precharge devices coupled to a plurality of the lines 120, 140, 160, 180 may depend in some embodiments on the total length of the line. As illustrated in FIG. 1, the lines 120, 140, 160, 180 may in some embodiments be considered as having the same number of sections as the number of charge sharing devices 110 to which they are coupled. For example, the lines 120, 140, 160, 180 in FIG. 1 each have two sections because they are each coupled to two charge sharing devices 110. As another example, however, one or more of the lines 120, 140, 160, 180 may include two sections with a single charge sharing device 110. Or, one or more of the lines 120, 140, 160, 180 may include three, four, or any number of sections, and two, three, four or any number of charge sharing devices 110. One section of one the lines 120, 140, 160, 180 may be coupled to a section of another one of the lines 120, 140, 160, 180 by none, one, or multiple charge sharing devices 110.

The charge sharing devices 110 may have less drive strength than, for example, the precharge devices 127, 147, 167, 187. In some embodiments, the charge sharing devices 110 may have approximately twenty times less drive strength than one or more of the precharge devices 127, 147, 167, 187. Because the charge sharing devices 110 may have less drive strength than one or more of the precharge devices 127, 147, 167, 187, the one or more precharge devices 127, 147, 167, 187 may be able to overpower the charge sharing devices 110, as explained in more detail below. In some embodiments, different charge sharing devices 110 may have different drive strengths. In some embodiments, several charge sharing devices 110 with low drive strength may be used in parallel to couple a plurality of lines 120, 140, 160, 180, whereas in other embodiments, a single charge sharing device 110 with a higher drive strength may be used to couple a plurality of lines 120, 140, 160, 180. In general, any number of charge sharing device(s) with any drive strength may be used.

As illustrated in FIG. 1, one charge sharing device 110 couples the first and second lines 120, 140 near the respective drivers 126, 146 of the first and second lines 120, 140, and another charge sharing device 110 couples the first and second lines 120, 140 in between the first and second sections of the respective lines 120, 140. Other positioning of one or more charge sharing devices 110 is also possible. As an example, if there are three charge sharing devices 110 and three sections, one charge sharing device 110 may couple the lines 120, 140 near the respective drivers 126, 146, the second charge sharing device 110 may couple the lines 120, 140 in between the first and second sections of the lines 120, 140, and the third charge sharing device 110 may couple the lines 120, 140 in between the second and third sections of the lines 120, 140.

Returning to FIG. 1, in operation, each of the lines 120, 140, 160, 180 may be precharged to a certain logic level. For example, the first line 120 may be precharged to a logic low by the precharge device 127, the second line 140 may be precharged to a logic high by the precharge device 147, the third line 160 may be precharged to a logic low by the precharge device 167, and the fourth line 180 may be precharged to a logic high by the precharge device 187. In some embodiments, the lines 120, 140, 160, 180 may all be precharged at the same time by, for example, a precharge control signal (not shown).

Following the precharging of all of the lines 120, 140, 160, 180, each line may be driven to a respective logic level that is to be placed on each of the respective lines 120, 140, 160, 180 by a respective driver 126, 146, 166, 186. For example, all of the lines 120, 140, 160, 180 may be driven to a logic high, or all of the lines 120, 140, 160, 180 may be driven to a logic low, or one or more of the lines 120, 140, 160, 180 may be driven to a logic high while one or more of the lines 120, 140, 160, 180 are driven to a logic low. In general, the lines 120, 140, 160, 180 may be driven to any logic level and the logic level may depend on the respective data to be placed on each of the respective lines 120, 140, 160, 180 in order to, for example, provide the data at the respective output nodes OUT.

For the lines precharged to a logic high (e.g., the second and fourth lines 140, 180), the respective driver may drive the respective line to the respective logic level that is to be placed on the line by selectively maintaining the logic high on the line or selectively discharging the charge associated with the logic high (by, for example, coupling the line to a reference voltage node such as ground). For the lines precharged to a logic low (e.g., the first and third lines 120, 160), the respective driver may drive the respective line to the respective logic level that is to be placed on the line by selectively maintaining the logic low on the line or selectively charging the line to a logic high (by, for example, coupling the line to a voltage source node, such as VCC).

Once each of the lines 120, 140, 160, 180 are driven to their respective logic levels by their respective drivers 126, 146, 166, 186, the logic level for each line is provided to the respective output nodes OUT. While the lines 120, 140, 160, 180 are being driven and/or while the data is provided to the respective output nodes OUT, one or more of the charge sharing devices 110 may be disabled (e.g., turned off) so as to not interfere with the driving of the logic levels.

In preparation for driving new logic levels, each of the lines 120, 140, 160, 180 may again be precharged to one or more respective precharge logic levels. The charge sharing devices that couple the first and second lines 120, 140, and that also couple the third and fourth lines 160, 180, may help reduce the amount of charge needed to precharge one or more of the lines, which may in turn reduce power consumption during operation. For example, after the lines 120, 140, 160, 180 have been driven to respective logic levels and the data provided to the output nodes OUT, the charge sharing devices 110 may be enabled (e.g., turned on) before the respective precharge devices 127, 147, 167, 187 begin precharging the respective lines 120, 140, 160, 180 in order to selectively allow charge to flow between the lines which the charge sharing devices 110 couple.

For example, if the first line 120 was driven to a logic high and the second line 140 was driven to a logic low, and the first line 120 is to be precharged to a logic low and the second line 140 is to be precharged to a logic high, the charge sharing devices 110 may allow charge to flow (e.g., be transferred) from the first line 120 to the second line 140, instead of discharging the charge from the first line 120 to a reference voltage node, such as ground. As another example, if the first line 120 was driven to a logic low and the second line 140 was driven to a logic low, and the first line 120 is to be precharged to a logic low and the second line 140 is to be precharged to a logic high, the charge sharing devices 110 may not allow any charge to flow because there is no charge on the first line 120 that could flow to the second line 140. As another example, if the first line 120 was driven to a logic low and the second line 140 was driven to a logic high, and the first line 120 is to be precharged to a logic low and the second line 140 is to be precharged to a logic high, the charge sharing devices 110 may not allow any charge to flow because the first and second lines 120, 140 are already at the appropriate precharge logic levels. As another example, if the first line 120 was driven to a logic high and the second line 140 was driven to a logic high, and the first line 120 is to be precharged to a logic low and the second line 140 is to be precharged to a logic high, the charge sharing devices 110 may not allow any charge to flow because the only line 140 to be precharged to logic high is already at logic high. In this example, the charge from the first line 120 may be discharged by, for example, coupling the first line 120 to a reference voltage node such as ground.

As discussed above, following the charge sharing, the lines 120, 140, 160, 180 may each be precharged to their respective precharge logic levels. During precharge, the charge sharing devices 110 may in some embodiments be disabled, whereas in other embodiments the charge sharing devices 110 may be overpowered by precharge devices 127, 147, 167, 187 due to, for example, the charge sharing devices have less drive strength than the precharge devices 127, 147, 167, 187. Following the precharging, each line 120, 140, 160, 180 may again be driven to a respective logic level that is to be placed on each respective line.

By having lines 120, 140, 160, 180 charged to alternating logic levels and using charge sharing devices, the amount of charge needed to precharge one or more of the lines may be reduced (which may in turn reduce power consumption) as compared to precharge lines that are all charged to a logic high and do not have charge sharing devices. Additionally, depending on the data placed on the lines, the charge sharing devices 110 may cause the lines 120, 140, 160, 180 in some embodiments to be precharged more quickly because the charge sharing devices may begin charging (or discharging) one or more of the lines to its respective precharge level.

Figure 2:
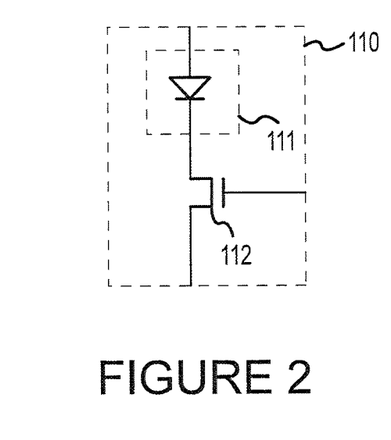
FIG. 2 is a schematic diagram of a charge sharing device according to an embodiment of the invention.
Figure 2A:
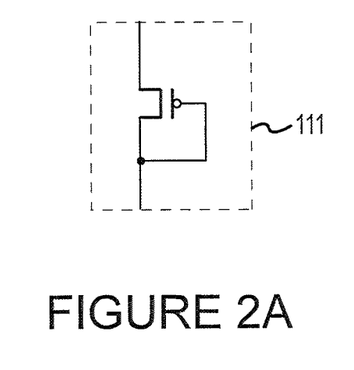
FIG. 2A is a schematic diagram of a charge flow control device according to an embodiment of the invention.

FIG. 2 illustrates one embodiment of a charge sharing device 110 according to an embodiment of the invention. The charge sharing device 110 may include a charge flow control device 111, such as a diode, and a switch 112, such as an n-channel field effect transistor (nFET), coupled in series. FIG. 2 will be described with a diode 111 as the charge control device, and an nFET 112 as the switch, although other charge control devices and/or other switches may be used in some embodiments. The anode of the diode 111 may be coupled to a line (e.g., line 120) that is to be precharged to a logic low. The cathode of the diode 111 may be coupled to the drain of the nFET 112, and the source of the nFET 112 may be coupled to a line (e.g., line 140) that is to be precharged to a logic high. The gate of the nFET 112 may be coupled to a precharge control circuit, which may provide a precharge control signal to enable the charge sharing device 110. In some embodiments, the diode may be a p-channel field effect transistor (pFET) with its gate coupled to its drain, as illustrated in the charge flow control device 111 in FIG. 2A. Returning to FIG. 2, the diode 110 may allow charge to only flow in one direction and the nFET 112 may be used to enable and disable the charge sharing device. In operation, the charge sharing device 110 may allow charge to flow from the line coupled to the anode of its diode 111 to the line coupled to the source of the nFET 112 when the charge sharing device 110 is enabled and the logic level on the line coupled to the anode of the diode 111 is high and the logic level on the line coupled to the source of the nFET is low. When the charge sharing device 110 is disabled, when the logic level on the line coupled to the anode of the diode 111 is low (e.g., when there is no charge on the line), or when the same logic level is present on the line coupled to the anode and on the line coupled to the source of the nFET 112 (e.g., when both lines have approximately the same amount of charge), the charge sharing device 110 may not allow charge to flow.

Figure 3:
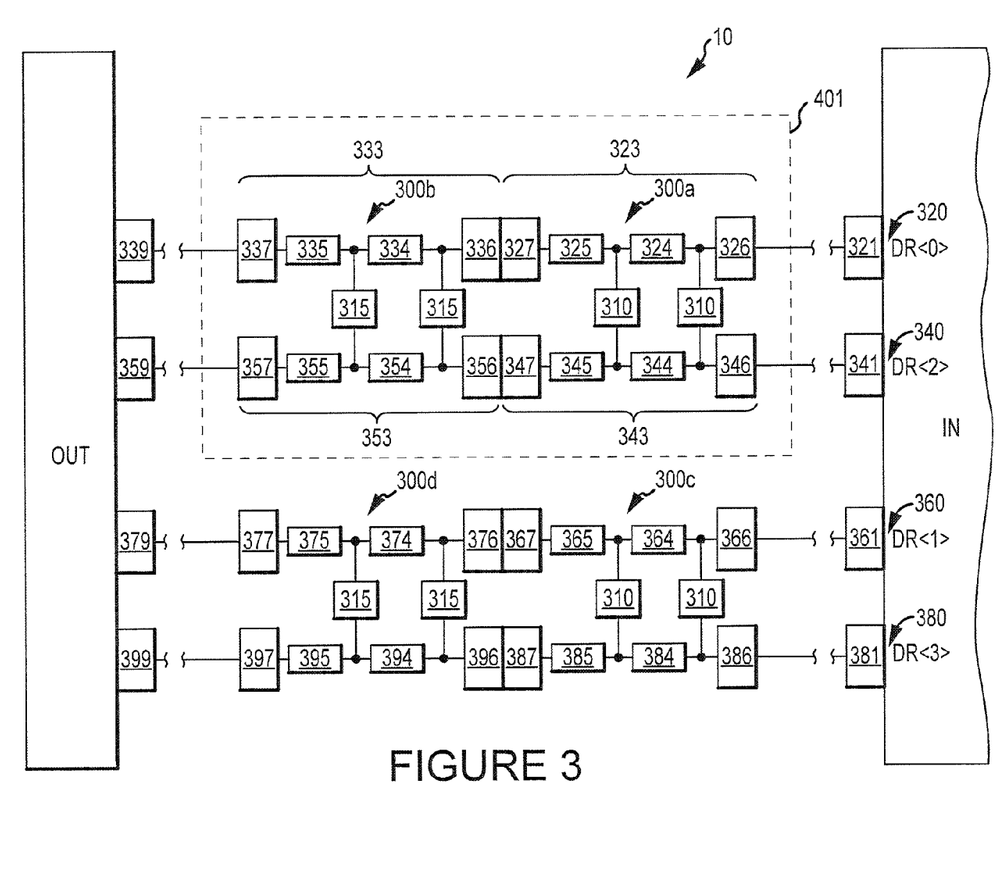
FIG. 3 is a block diagram of a portion of an apparatus with a plurality of charge sharing systems according to an embodiment of the invention.

FIG. 3 illustrates an apparatus 10 with a plurality of precharge style lines 320, 340, 360, 380 and a plurality of charge sharing systems 300*a*, 300*b*, 300*c*, 300*d* according to an embodiment of the invention. The charge sharing systems 300*a*, 300*c* may be similar to the charge sharing systems 100*a*, 100*c* illustrated in FIG. 1, and the lines 320, 340, 360, 380 may be similar to the lines 120, 140, 160, 180 illustrated in FIG. 1, except that the lines 320, 340, 360, 380 illustrated in FIG. 3 may be divided into a plurality of segments because, for example, they may be relatively long. Each line may, in some embodiments, be driven with an initial driver, may include any number of segments, and may include a final precharge device. For example, the first line 320 may include an initial driver 321, at least two segments 323, 333, and a final precharge device 339. Second, third, and fourth lines 340, 360, 380 may be similarly configured. Although not illustrated in FIG. 3, the lines 320, 340, 360, 380 may include additional segments, or may alternatively include only one segment (e.g., like the lines 120, 140, 160, 180 in FIG. 1) or two segments. In general, the lines 320, 340, 360, 380 may include any number of segments, although in FIG. 3 only two complete segments are illustrated for each line 320, 340, 360, 380.

Each segment of the lines 320, 340, 360, 380 may include a driver, one or more sections, and a precharge device. For example, the first segment 323 of the first line 320 may include a driver 326, two sections 324, 325, and a precharge device 327, and the second segment 333 of the first line 320 may include a driver 336, two sections 334, 335, and a precharge device 337. Each segment of the lines 320, 340, 360, 380 may be coupled to a corresponding segment of another line via one or more charge sharing devices 310, 315. For example, the first segment 323 of the first line 320 may be coupled to the first segment 343 of the second line 340 via two charge sharing devices 310, and the two charge sharing devices 310 may correspond to the first and second sections 324, 325 of the first segment 323 of the line 320. Each charge sharing device 310 may be similar in structure and operation to the charge sharing device 110 illustrated in FIG. 2. Similarly, the second segment 333 of the first line 320 may be coupled to the second segment 353 of the second line 340 via two charge sharing devices 315, and the two charge sharing devices 315 may correspond to the first and section sections 334, 335 of the second segment 333 of the first line 320. Each charge sharing device 315 may be similar in structure and operation to the charge sharing device 110 illustrated in FIG. 2, although the charge sharing devices 315 may be positioned differently, such as being flipped as compared with the charge device 110 illustrated in FIG. 2. As in FIG. 1, each segment of line may be coupled to another segment by any number of charge sharing devices.

In operation, the segments within each of the lines 320, 340, 360, 380 may be precharged to alternating logic levels. For example, the first segment 323 of the first line 320 may be precharged to a logic low, and the second segment 333 of the first line 320 may be precharged to a logic high. Also, the first segments for each of the lines 320, 340, 360, 380 may be precharged to alternating logic levels. For example, the first segment 343 of the second line 340 may be precharged to a logic high, and the second segment 353 of the second line 340 may be precharged to a logic low.

The operation of the first segments 323, 343 of the first and second lines 320, 340 may be similar to the operation of the first and second lines 120, 140 described above in connection with FIG. 1 (which may be considered "single-segment" lines). The operation of the second segments 333, 353 of the first and second lines 320, 340 may also be similar to the operation of the lines 120, 140 described above, except that the precharge logic levels for the second segments 333, 353 are flipped. In other words, as described above, the second segments 333, 353 may be precharged to opposite logic levels as the lines 120, 140 illustrated in FIG. 1. Accordingly, the charge sharing devices 315 are configured to allow charge to flow from segment 353 to segment 333 when enabled, and as mentioned above, may be similar in structure and operation to the charge sharing device 110 illustrated in FIG. 2.

By having the segments of lines 320, 340, 360, 380 charged to alternating logic levels (alternating both between segments and between lines) and using charge sharing devices, the amount of charge needed to precharge one or more of the lines may be reduced (which may in turn reduce power consumption) as compared to segmented precharge lines where the first segment of every line is precharged to a logic level (e.g., logic high), the second segment of every line is precharged to another logic level (e.g., logic low), etc., and that do not have charge sharing devices.

The charge sharing systems 300a, 300b may together form a multi-segment charge sharing system 401, one embodiment of which is described below.

With reference now to the schematic diagram illustrated in FIG. 4, one embodiment of a multi-segment charge sharing system 401 will be described. The multi-segment charge sharing system 401 may include a plurality of charge sharing systems 400a, 400b, each of which may be associated with a segment of two lines 420, 440. A first charge sharing system 400a may include a first segment 423 of a first line 420, a first segment 443 of a second line 440, and one or more charge sharing devices 410.

The first segment 423 of the first line 420 may include a driver 426 and a precharge device 427 coupled in series by a first section 424 and a second section 425. The driver 426 may be a pFET, which may receive a signal DR<0> from a source (such as a previous segment, an input node, or any other source) at its gate. Also, a precharge device 422 of a previous segment may, in some embodiments, be coupled to the gate of the pFET driver 426. In some embodiments, a keeper circuit (not shown in FIG. 4) may be coupled to the gate of the pFET driver 426 in order to maintain the voltage level of the gate at a certain level. The source of the pFET driver 426 may be coupled to a voltage source node, such as VCC, and the drain of the pFET driver 426 may be coupled to the first section 424. The first section 424 may also be coupled to the second section 425, and the second section 425 may be coupled to a precharge device 427 and to a driver 436 of the next segment 433. The precharge device 427 may be an nFET, with the second section 425 coupled to its drain, and its source coupled to a reference voltage node, such as ground. The gate of the nFET precharge device 427 may receive a RECHARGE-B signal from a second precharge control circuit 20b. The second precharge control circuit 20b may generate the PRECHARGE-B signal (and a corresponding PRECHARGE-B/ signal, with the PRECHARGE-B/ signal being the complement of the PRECHARGE-B signal) in response to receiving a RECHARGE-A signal from a first precharge control circuit 20a. The first and second sections 424, 425 may represent lumped capacitances and resistances of portions of the line 420.

The first segment 443 of the second line 440 may include a driver 446 and a precharge device 447 coupled in series by a first section 444 and a second section 445. The driver 446 may be an nFET, which may receive a signal DR<2> from a source (such as a previous segment, an input node, or any other source) at its gate. Also, a precharge device 442 of a previous segment may, in some embodiments, be coupled to the gate of the nFET driver 446. In some embodiments, a keeper circuit (not shown in FIG. 4) may be coupled to the gate of the nFET driver 446 in order to maintain the voltage level of the gate at a certain level. The source of the nFET driver 446 may be coupled to a reference voltage node, such as ground, and the drain of the nFET driver 446 may be coupled to the first section 444. The first section 444 may also be coupled to the second section 445, and the second section 445 may be coupled to a precharge device 447 and to a driver 456 of the next segment 453. The precharge device 447 may be a pFET, with the second section 445 coupled to its drain, and its source coupled to a voltage source node, such as VCC. The gate of the pFET precharge device 447 may receive the RECHARGE-B/ signal from the second precharge control circuit 20b. The first and second sections 444, 445 may represent lumped capacitances and resistances of portions of the line 440.

Two charge sharing devices 410 may couple the first segment 423 of the first line 420 to the first segment 443 of the second line 440. The charge sharing devices 410 may be similar to the charge sharing device 110 illustrated in FIG. 2, and may include a charge flow control device 411, such as a diode, coupled in series with a switch 412, such as an nFET. FIG. 4 will be described with a diode 411 as the charge control device, and an nFET 412 as the switch, although other charge control devices and/or other switches may be used in some embodiments. The gates of the nFETs 412 of the charge sharing devices 410 may receive the RECHARGE-A signal from the first precharge control circuit 20a. The anodes of the diodes 411 in the charge sharing devices 410 may be coupled to the first segment 423 of the first line 420. In some embodiments, the anode of the diode 411 of one charge sharing device 410 may be coupled to the first segment 423 near the drain of the pFET driver 426, and the anode of the diode 411 of the other charge sharing device 410 may be coupled to the first segment 423 in between the first and second sections 424, 425 of the first segment 423. The sources of the nFETs 412 in the charge sharing devices 410 may be coupled to the first segment 443 of the second line 440. In some embodiments, the source of the nFET 412 of one charge sharing device 410 may be coupled to the first segment 443 near the drain of the nFET driver 446, and the source of the nFET 412 of the other charge sharing device 410 may be coupled to the first segment 443 in between the first and second sections 444, 445 of the first segment 443.

Figure 4:
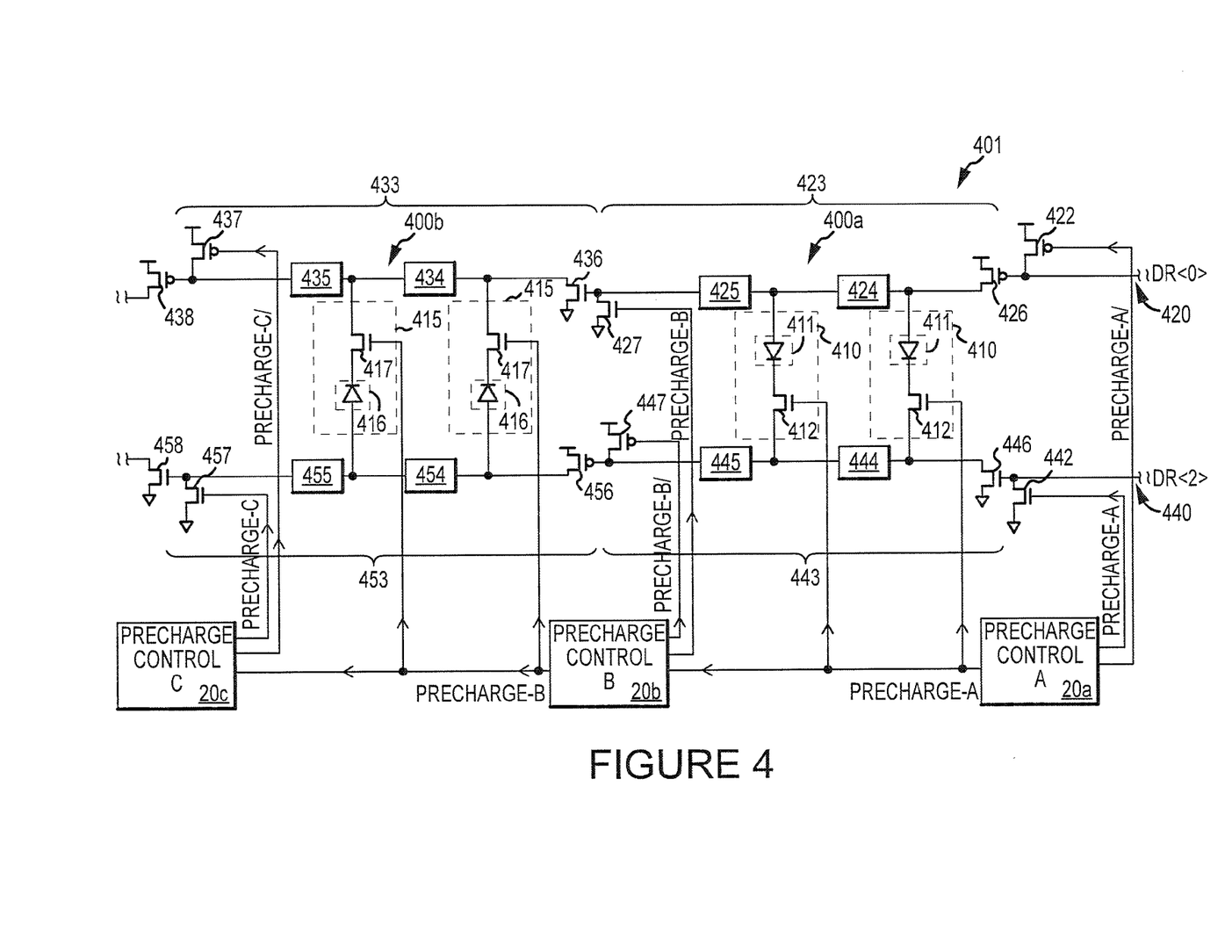
FIG. 4 is a schematic diagram of a portion of an apparatus with a plurality of charge sharing systems according to an embodiment of the invention.

In some embodiments, and as illustrated in FIG. 4, the charge sharing devices 410 may not need a separate timing signal, but instead may use the RECHARGE-A signal generated in the precharge control circuit 20a and used to control the precharge devices 422, 442 of the previous segment, and which is subsequently propagated to the precharge devices 427, 447 via the second precharge control circuit 20b. Also, in some embodiments and as illustrated in FIG. 4, the charge sharing devices 410 may introduce little to no added capacitance to the lines 420, 440 because of the relatively low capacitance of the diffusion areas that form the source of the nFETs 412 and/or the anode of the diode 411.

Still with reference to FIG. 4, a second charge sharing system 400b may include a second segment 433 of the first line 420, a second segment 453 of the second line 440, and one or more charge sharing devices 415. In general, the second segment 433 of the first line 420 may be similar to the first segment 443 of the second line 440 described above, and the second segment 453 of the second line 440 may be similar to the first segment 423 of the first line 420 described above, except that the precharge devices 437, 457 may receive RECHARGE-C/ and RECHARGE-C signals, respectively, from a third precharge control circuit 20c. Also, the charge sharing devices 415 may be similar to the charge sharing devices 110 illustrated in FIG. 2 and may receive the RECHARGE-B signal at the gates of their respective nFETs 417.

With reference now to the schematic diagram of FIG. 4 and the timing diagram of

Figure 5:
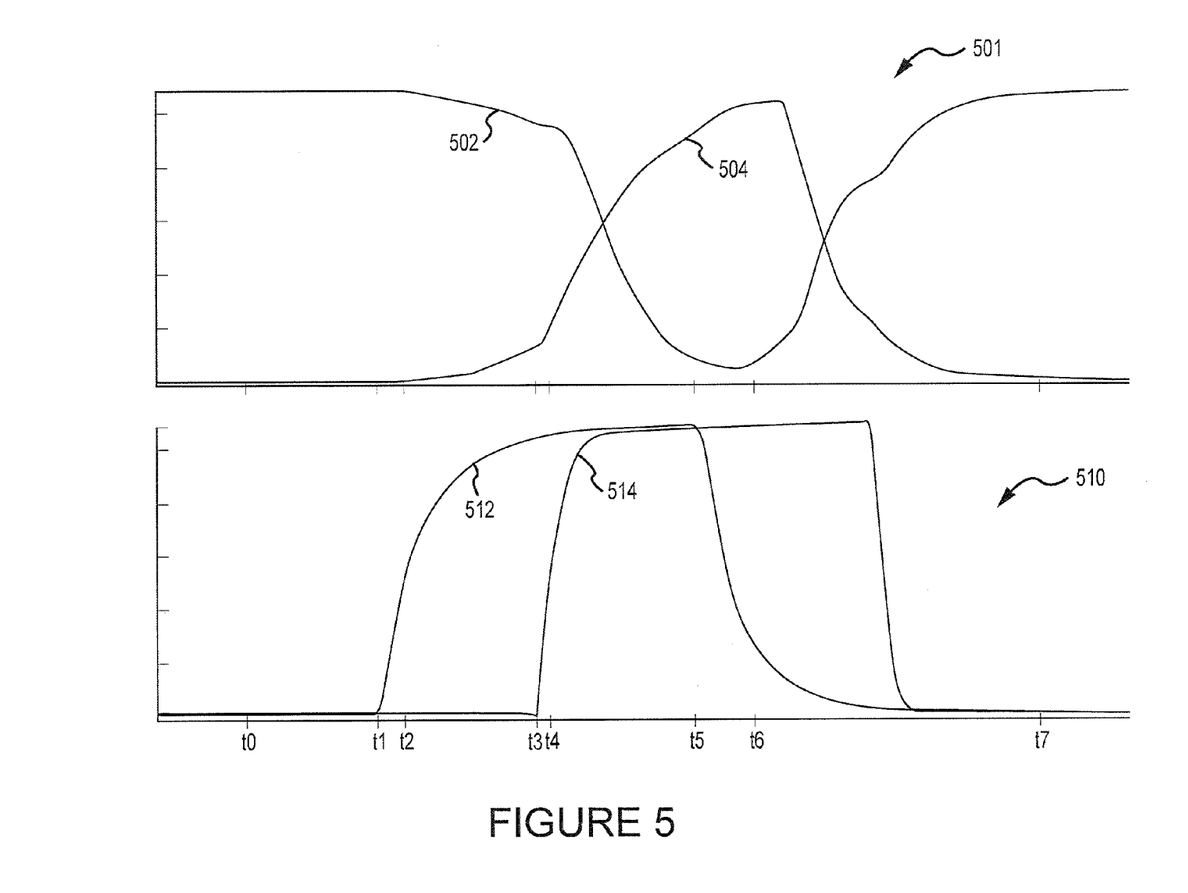
FIG. 5 is a timing diagram illustrating the operation of one of the charge sharing systems in FIG. 4 according to an embodiment of the invention

FIG. 5, the operation of the multi-segment charge sharing system 401 will now be described. In FIG. 5, a first waveform 501 may represent the voltage levels on the first and second lines 420, 440, and a second waveform 510 may represent the voltage levels generated by the precharge control circuits 20a, 20b. In FIG. 5, the first and second waveforms 501, 510 are illustrated using the same time axis. In the first waveform 501, a first signal 502 may represent the voltage level on the first segment 423 of the first line 420 at, for example, the point between the first and second sections 424, 425. A second signal 504 may represent the voltage level on the first segment 443 of the second line 440 at, for example, the point between the first and second sections 444, 445. In the second waveform 510, a third signal 512 may represent the RECHARGE-A signal generated by the first precharge control circuit 20a, and a fourth signal 514 may represent the RECHARGE-B signal generated by the second precharge control circuit 20b.

At time t0, the voltage level on the first segments 423, 443 of the first and second lines 420, 440 may be representative of data placed on the lines by the drivers 426, 446. In some embodiments, the first segment 423 of the first line 420 may be at approximately 1.35v, which may represent a logic high, and the first segment 443 of the second line 440 may be at approximately 0v, which may represent a logic low. These logic levels maybe the opposite of the logic levels that the first segments 423, 443 are to be precharged as described above.

At time t1, the RECHARGE-A signal 512 generated in the first precharge control circuit 20a may begin to rise. The RECHARGE-A signal 512 may begin to propagate towards the charge sharing devices 410 and also towards the second precharge control circuit 20b. When the RECHARGE-A signal 512 is received at the second precharge control circuit 20b, the RECHARGE-B signal 514 generated by the second precharge control circuit 20b may begin to rise (and the RECHARGE-B/ signal (not shown) generated by the second precharge control circuit 20b may begin to fall), thus enabling the precharge devices 427, 447 to precharge the first segments 423, 443 of the first and second lines 420, 440 to a logic low and a logic high, respectively.

However, due to the propagation delay of the line between the first precharge control circuit 20a and the second precharge control circuit 20b (which may be approximately the same length as and may have approximately the same propagation delay as the first segments 423, 443 of the first and second lines 420, 440), the RECHARGE-A signal 512 may reach the charge sharing devices 410 before it reaches the second precharge control circuit 20b. This propagation delay may be the difference between time t1 and time t3, or the difference between time t2 and time t4, and may be, for example 250 ps. Thus, if a charge sharing device 410 couples the first segments 423, 443 of the first and second lines 420, 440 near the drivers 426, 446 and/or near the precharge control circuit 20a, that charge sharing device 410 will be enabled at time t2, which may be relatively soon after t1. This may in turn allow charge to flow from the first segment 423 of the first line 420 to the first segment 443 of the second line 440 through the charge sharing device 410, because the voltage level on the first segment 423 of the first line 420 is logic high and the voltage level on the first segment 443 of the second line 440 is logic low. Also, if one or more other charge sharing device(s) 410 couple the first segments 423, 443 of the first and second lines 420, 440 along the length of the first and second lines 420, 440, these one or more other charge sharing device(s) 410 will be enabled and allow charge to flow. Thus, returning to FIG. 5, between time t2 and time t3, the voltage level on the first segment 423 of the first line 420 begins to decrease and the voltage level on the first segment of the second line 440 begins to increase because of the charge sharing through the two charge sharing devices 410.

At time t3, the RECHARGE-A signal 512 is received at the second precharge control circuit 20b, and the RECHARGE-B signal 514 generated therein may begin to rise (and the RECHARGE-B/ signal may begin to fall). At time t4, the RECHARGE B signal 514 (and RECHARGE-B/ signal) is received at the precharge devices 427, 447, which may be enabled. When the precharge devices 427, 447 are enabled, they may precharge the first and second lines 420, 440, and may overpower the charge sharing devices 410 because the charge sharing devices 410 may have less drive strength than the precharge devices 427, 447. Thus, the time available for charge sharing by the charge sharing devices 410 is generally from the time the charge sharing devices 410 are enabled until the time the precharge devices 427, 447 are enabled. Because the precharge devices 427, 447 are coupled to the drivers 436, 456 of the subsequent segments 433, 453 of the first and second lines 420, 440, the precharge devices 427, 447 may also disable the drivers 436, 456 relatively quickly so as to reduce current leakage during switching. As illustrated in the waveform 501, between time t2 when the charge sharing devices 410 are enabled and time t4 when the precharge devices 427, 447 are enabled, the voltage level on the first segment 423 of the first line 420 may decrease by approximately the same voltage the voltage level on the first segment 443 of the second line 440 increases due to the charge sharing.

At time t5, the RECHARGE-A signal 512 begins to fall, which in turn may cause the RECHARGE-B signal 514 generated in the second precharge control circuit 20b to begin to fall (and cause the RECHARGE-B/ signal (not shown) to rise). When the RECHARGE-A and RECHARGE-B signals fall (and the RECHARGE-B/ signal rises), the charge sharing devices 410 as well as the precharge devices 427, 447 may be disabled. At approximately time t6, the first segments 423, 443 of the first and second lines 420, 440 are precharged to logic low and logic high, respectively, and data is driven onto the lines 420, 440 by the drivers 426, 446, which subsequently causes the voltage levels on the first segments 423, 443 to once again change to logic high and logic low, respectively, at time t7.

The timing diagram in FIG. 5 illustrates the operation of the first charge sharing system 400a in the multi-segment charge sharing system 401 for one sequence of data (e.g., the first segment 423 of the first line 420 is driven to logic high, precharged to logic low, and subsequently driven to logic high, while the first segment 443 of the second line 440 is driven to logic low, precharged to logic high, and subsequently driven to logic low). As described above in connection with FIG. 1, other sequences of data are also possible. Also, the operation of the second charge sharing system 400b in the multi-segment charge sharing system 401 may be analogous to the operation of the first charge sharing system 400a, except that the second segments 433, 453 of the first and second lines 420, 440 are precharged to different logic levels and so the configuration and operation of the second charge sharing system 400b are generally reversed.

Figure 6:
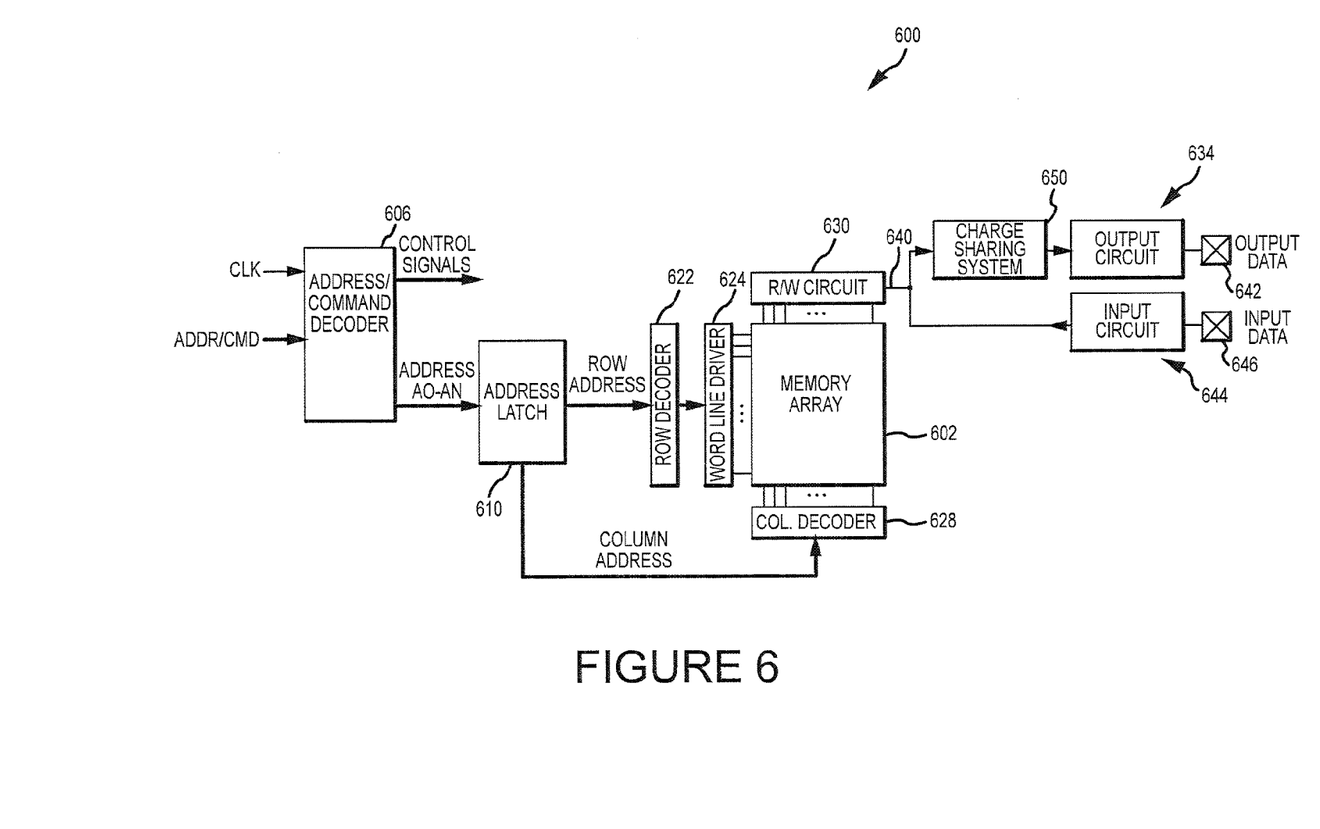
FIG. 6 is a block diagram of a memory having a charge sharing system.

FIG. 6 illustrates a portion of a memory 600 according to an embodiment of the present invention. The memory 600 includes an array 602 of memory cells, which may be, for example, DRAM memory cells, SRAM memory cells, flash memory cells, or some other types of memory cells. The memory 600 includes an address/command decoder 606 that receives memory commands and addresses through an ADDR/CMD bus. The address/command decoder 606 generates control signals, based on the commands received through the ADDR/CMD bus. The address/command decoder 606 also provides row and column addresses to the memory 600 through an address bus and an address latch 610. The address latch then outputs separate column addresses and separate row addresses.

The row and column addresses are provided by the address latch 610 to a row address decoder 622 and a column address decoder 628, respectively. The column address decoder 628 selects bit lines extending through the array 602 corresponding to respective column addresses. The row address decoder 622 is connected to word line driver 624 that activates respective rows of memory cells in the array 602 corresponding to received row addresses. The selected data line (e.g., a bit line or bit lines) corresponding to a received column address are coupled to a read/write circuitry 630 to provide read data to a data output circuit 634 via an input-output data bus 640. An output pad 642 coupled to the data output circuit 634 is used for electrically coupling to the memory 600. Write data are provided to the memory array 602 through a data input circuit 644 and the memory array read/write circuitry 630. An input pad 646 coupled to the data input circuit 642 is used for electrically coupling to the memory 600.

At least a portion of the input-output data bus 640 may include a charge sharing system 650, which may be similar to any of the charge sharing systems 100a, 100c, 300a, 300b, 300c, 300d, 400a, 400b described above, and may include one or more charge sharing devices. In addition to or in place of the charge sharing system 650 on the input-output data bus 640, a charge sharing system may also be included in the read/write circuitry 630, in between the memory array 602 and the read/write circuitry 630, or in any other location.

From the foregoing it will be appreciated that, although specific embodiments of the invention have been described herein for purposes of illustration, various modifications may be made without deviating from the spirit and scope of the invention. For example, FIGS. 1, 3, and 4 illustrate embodiments of charge sharing systems. However, the charge sharing systems and/or the charge sharing devices therein are not limited to having the same design, and may be of different designs and include different circuitry from one another. For example, the diode in the charge sharing device 110, illustrated in FIG. 2 may be replaced with a different type of charge flow control device. As another example, the nFET in the charge sharing device 110 illustrated in FIG. 2 may be replaced with a pFET. Also, other charge sharing devices may be used, which may or may not include a diode or other charge flow control device and/or an nFET or pFET.

Also, although the precharge style lines illustrated in FIGS. 1, 3, and 4 are DR lines, the precharge style lines may be any other type of lines, for example write data (WR) lines. Also, although FIGS. 1, 3, and 4 illustrate precharging lines to certain logic levels, other logic levels may be used. For example, for a set of lines DR<0-7>, the precharge logic levels on the lines may be low, low, high, high, low, low, high, high, or it may be low, high, low, high, low, high, low, high. In these embodiments, approximately half of the lines may be precharged to one logic level and the other half of the lines may be charged to the opposite logic level. In other embodiments, however, less or more than half of the lines may be precharged to a particular logic level. For example, a third of the lines may be precharged to a logic low with two-thirds of the lines precharged to a logic high (e.g., low, high, high, low, high, high, etc.). Any other combination of precharge logic levels may also be used. The precharge logic levels used may depend on, for example, the physical layout of the lines and/or the data to be placed on the lines.

Also, in the embodiments described above, the charge sharing may occur just before precharging of the respective lines. In other embodiments, however, charge sharing may occur just before driving the respective lines with data to be placed on the lines.

Accordingly, the invention is not limited except as by the appended claims.

What is claimed is:

1. A charge sharing system, comprising:
   a first line configured to be driven to a first voltage representative of data to be placed on the first line and then precharged to a first precharge voltage;
   a second line configured to be driven to a second voltage representative of data to be placed on the second line and then precharged to a second precharge voltage; and
   a charge sharing device coupled between the first line and the second line and configured to selectively allow charge from the first voltage representative of data to flow from the first line to the second line after the first and second lines are driven to the respective first and second voltages representative of data to be placed on the respective lines.

2. The charge sharing system of claim 1, wherein the charge sharing device comprises a charge flow control device in series with a switch.

3. The charge sharing system of claim 2, wherein the charge flow control device comprises a diode and the switch comprises a transistor.

4. The charge sharing system of claim 2, wherein the charge flow control device comprises a pFET with a gate of the pFET coupled to a drain of the pFET.

5. The charge sharing system of claim 2, wherein the charge flow control device is configured to prevent charge from the second line from flowing to the first line.

6. The charge sharing system of claim 1, wherein the second precharge voltage is greater than the first precharge voltage.

7. The charge sharing system of claim 1, wherein the charge sharing device is a first charge sharing device, the first line is configured to be driven by a first driver and comprises a first segment and a second segment, the second line is configured to be driven by a second driver and comprises a third segment and a fourth segment, the first segment is coupled to the second segment through a third driver, the first segment is also coupled to the third segment through the first charge sharing device, the third segment is coupled to the fourth segment through a fourth driver, and the second segment is coupled to the fourth segment through a second charge sharing device.

8. The charge sharing system of claim 1, wherein the first and second lines are data read lines coupling a memory array to an output node.

9. The charge sharing system of claim 1, further comprising a third and fourth line configured to be driven to a respective third and fourth voltages representative of data to be placed on the third and fourth lines and then precharged to the first precharge voltage and the second precharge voltage, respectively.

10. The charge sharing system of claim 1, further comprising first and second precharge circuits coupled to a respective line and configured to precharge the respective line to a respective precharge voltage, the precharge voltages of the first and second lines being different.

11. The charge sharing system of claim 10, further comprising a precharge control circuit, the precharge control circuit configured to enable the charge sharing circuit to allow charge from the first line to flow to the second line before enabling the first and second precharge circuits to precharge the respective line.

12. The charge sharing system of claim 10, wherein the first and second precharge circuit comprise transistors, and wherein the drive strength of the charge sharing device is less than the drive strength of the transistors.

13. A circuit, comprising:
a first data read line with a first section and a second section coupled to each other;
a first driver coupled to the first section of the first data read line and configured to drive the first data read line to a first voltage representative of data to be placed on the first line;
a first precharge device coupled to the second section and configured to precharge the first data read line to a first precharge voltage;
a second data read line with a third section and a fourth section coupled to each other;
a second driver coupled to the third section of the second data line and configured to drive the second data read line to a second voltage representative of data to be placed on the second line;
a second precharge device coupled to the fourth section and configured to precharge the second data read line to a second precharge voltage;
a first charge sharing device coupled to the first section of the first line and the third section of the second line, the first charge sharing device comprising a first charge flow control device and a first switch; and
a second charge sharing device coupled to the second section of the first line and the fourth section of the second line, the second charge sharing device comprising a second charge flow control device and a second switch.

14. The circuit of claim 13, wherein the first charge flow control device comprises a first diode and the second charge flow control device comprises a second diode.

15. The circuit of claim 13, wherein the first switch comprises an nFET and the second switch comprises an nFET.

16. The circuit of claim 13, wherein the first and second switches are configured to receive a precharge signal from a precharge control circuit that switches the first and second switches on and off.

17. The circuit of claim 16, wherein the first and second precharge devices also are configured to receive the precharge signal after the first and second switches receive the precharge signal.

18. The circuit of claim 17, wherein the first and second precharge devices receive the precharge signal after a propagation delay.

19. The circuit of claim 13, wherein the first driver comprises a pFET, the first precharge device comprises an nFET, the second driver comprises an nFET, and the second precharge device comprises a pFET.

20. The circuit of claim 13, further comprising a third precharge device and wherein the first data read line further includes a third and fourth section coupled to each other, the third precharge device coupled to the fourth section of the first data read line and configured to precharge the third and fourth sections of the first data read line to a third precharge voltage, the third precharge voltage different than the first precharge voltage.

21. The circuit of claim 20, wherein the third precharge voltage and the second precharge voltage are the same voltages.

22. A method, comprising:
driving a plurality of lines to a plurality of respective logic levels representative of data to be placed on the plurality of lines;
prior to precharging the plurality of lines to a plurality of respective precharge voltages, selectively sharing charge between a first line and a second line through a charge sharing device coupled between the first line and the second line, the plurality of lines including the first line and the second line; and
precharging the plurality of lines to a plurality of respective precharge voltages, the first line being precharged to a voltage representative of a first logic level and the second line being precharged to a voltage representative of a second logic level.

23. The method of claim 22, wherein the voltage representative of the second logic level is logic high.

24. The method of claim 23, wherein the voltage is a voltage provided by a voltage source.

25. The method of claim 23, wherein the selectively sharing charge comprises selectively beginning to charge the second line to logic high.

26. The method of claim 23, wherein the second line is driven to logic high and no charge is shared between the first line and the second line during the selectively sharing charge.

27. The method of claim 23, wherein the first line is driven to logic high, the second line is driven to logic low, and charge is shared from the first line to the second line during the selectively sharing charge.

28. The method of claim 22, further comprising disabling the charge sharing device during the driving.

29. The method of claim 28, further comprising reading the data placed on the lines during the driving.

30. The method of claim 22, wherein the plurality of representative logic levels is a first plurality and further comprising again driving the plurality of lines to a second plurality of respective logic levels representative of data to be placed on the lines following the precharging.

31. The method of claim 22, wherein half of the plurality of lines is precharged to the voltage representative of the first logic level.

32. The method of claim 31, wherein adjacent lines within the plurality of lines are charged to voltages representative of different logic levels.

33. The method of claim 22, wherein selectively sharing charge between the first line and the second line occurs after driving the plurality of lines to a plurality of respective logic levels and begins prior to precharging the plurality of lines.

* * * * *